United States Patent
Kusner et al.

[11] Patent Number: 6,103,135
[45] Date of Patent: Aug. 15, 2000

[54] MULTI-LAYER LAMINATE AND METHOD OF PRODUCING SAME

[75] Inventors: Mark Kusner, Gate Mills; Michael A. Centanni, Parma; Joseph A. Potkonicky, Jr., Willoughby, all of Ohio

[73] Assignee: GA-TEK Inc., Eastlake, Ohio

[21] Appl. No.: 09/277,101

[22] Filed: Mar. 26, 1999

[51] Int. Cl.[7] .................................................. H05K 3/36
[52] U.S. Cl. .............................. 216/20; 216/33; 156/151; 156/324
[58] Field of Search .................................... 216/7, 13, 20, 216/33, 36, 43, 90, 91, 95, 100, 102, 103, 105, 106, 108; 29/830, 847; 205/920; 427/98; 439/591; 156/52, 151, 155, 185, 27.5, 303, 306.6, 307, 324

[56] References Cited

U.S. PATENT DOCUMENTS

| | | | |
|---|---|---|---|
| 4,411,982 | 10/1983 | Shibuya et al. | 430/314 |
| 4,814,855 | 3/1989 | Hodgson et al. | 174/52.4 |
| 5,242,562 | 9/1993 | Beyerle et al. | 204/206 |
| 5,589,280 | 12/1996 | Gibbons et al. | 428/626 |
| 5,603,158 | 2/1997 | Murata et al. | 29/846 |
| 5,638,597 | 6/1997 | Cutting et al | 29/830 |
| 5,681,443 | 10/1997 | Ameen et al. | 205/125 |
| 5,685,970 | 11/1997 | Ameen et al. | 205/138 |

*Primary Examiner*—Randy Gulakowski
*Assistant Examiner*—Allan Olsen
*Attorney, Agent, or Firm*—Mark Kusner; Michael A. Centanni

[57] ABSTRACT

A method of forming a multi-layer laminate from a plurality of individual laminates comprised of copper clad on a polyimide.

15 Claims, 7 Drawing Sheets

MULTI-LAYER LAMINATE AND METHOD OF PRODUCING SAME

FIELD OF THE INVENTION

The present invention relates generally to electronic circuits, and more particularly, to components used in the manufacturing of multi-layer printed circuits and a method of forming the same.

BACKGROUND OF THE INVENTION

In the manufacture of printed circuits, namely printed circuit boards or copper clad laminates, sheets of copper foil are typically bonded to a dielectric layer of a partially cured epoxy resin impregnated with woven glass fiber (conventionally referred to as a "pre-preg") as in the case of a circuit board, or onto another layer or foil as in the case of a copper clad laminate.

The copper foil used in forming printed circuit boards is typically produced by an electrodeposition process that forms a generally continuous strip of copper. This strip is ultimately cut into sheets that are used to form copper clad laminates. Printed circuit manufacturers use the laminates to produce printed circuit boards. A particular problem associated with the formation of printed circuit boards and copper clad laminates is contamination of the foil sheet. In this respect, any foreign matter, such as resin dust, fiberglass fibers, hair, grease, oil or the like, may result in dots, dents, deposits or pits on the copper foil that can adversely affect the later formation of the conductive paths forming the printed circuits.

Contamination of the copper foil may occur at any of the different processing steps the foil undergoes from its initial formation to its use in forming printed circuits. For example, contamination may occur following the manufacturing of the copper foil, particularly during the steps in preparing the copper foil for shipping and during the manufacturing steps in preparing and bonding the copper foil to a substrate or to another foil sheet. Cutting the foil strip into sheets may result in small metal slivers or shavings on the foil. Further, other machinery and materials used in moving the foil may be a source of other types of contamination, such as dust, grease or oil droplets, that may fall onto the surface of the foil and become embedded therein as the foil passes over rollers and other surfaces.

To protect the copper foil during subsequent handling and shipping, it has been known to secure a metal substrate to one side of a copper foil to protect the same. However, each of the foregoing steps in protecting and insuring against contamination of the foil is costly and time-consuming.

The present invention overcomes the need to ship and protect the copper foil by forming printed circuits on a polyimide film. The circuits are generated by a continuous process. Multi-layer laminates are made by securing like films having printed circuits thereon.

SUMMARY OF THE INVENTION

In accordance with the present invention, there is provided a method of forming a multi-layer laminate, comprising the steps of:

a) forming a generally continuous strip comprised of polyimide film having a flash layer of metal deposited on at least one side thereof;

b) moving the strip along a predetermined path through a metal plating bath;

c) depositing metal onto the flash layer of metal on said polyimide film;

d) masking the metal on at least one side of the polyimide film to define a circuit pattern;

e) chemically etching exposed metal from said polyimide strip;

f) dissolving away said masking material wherein a built-up circuit pattern remains on the polyimide film;

g) moving a second strip comprised of polyimide film along a second path that merges with the first path, the second strip having a second printed circuit formed thereon in accordance with steps b) through f), the second printed circuit having a predetermined shape adapted to mate in complimentary fashion with the first circuit when overlaid thereon;

h) interlaying a dimensionally stable, uncured adhesive film between the first polyimide strip and the second polyimide strip;

i) joining together the first polyimide film, the adhesive film and the second polyimide film wherein the first circuit pattern on the first strip is in registry with the second circuit pattern on the second strip;

j) curing the adhesive film to bond the first polyimide strip to the second polyimide strip; and k) forming microvias between the first polyimide film and the second polyimide film to connect locations of the first printed circuit with locations of the second printed circuit.

In accordance with another aspect of the present invention there is provided a method of forming a multi-layer laminate, comprising the steps of:

a) forming a generally continuous strip comprised of a first polyimide film having a flash layer of metal deposited on at least one side thereof;

b) moving the strip of the first polyimide film along a first path through a metal plating bath;

c) depositing metal onto the flash layer of metal as the strip of first polyimide film passes through the bath to build a metal onto the flash layer of metal;

d) masking the metal on the at least one side of the first polyimide film to define a circuit pattern thereon;

e) etching away the flash metal and the metal on the first polyimide film wherein the built-up circuit pattern remains on the polyimide film;

f) removing the masking material;

g) moving a second strip comprised of polyimide film along a second path that merges with the first path, the second strip having a second printed circuit formed thereon in accordance with steps b) through f), the second printed circuit having a predetermined shape adapted to mate in complimentary fashion with the first circuit when overlaid thereon;

It is an object of the present invention to provide a method of forming a multi-layer printed circuit.

Another object of the present invention is to provide a method of forming a multi-layer printed circuit as described above, wherein the multi-layer printed circuits are formed in a generally continuous process.

Another object of the present invention is to provide a method of forming a multi-layer circuit as described above, wherein the multi-layer circuit is formed from a plurality of copper-on-polyimide laminates.

Another object of the present invention is to provide a method of forming a multi-layer circuit as described above, wherein said laminates are bonded together by an adhesive applied thereto.

A still further object of the present invention is to provide a method of forming a multi-layer circuit as described above, wherein the adhesive is a dimensionally stable film.

These and other objects and advantages will become apparent from the following description of preferred embodiments of the invention, taken together with the accompanying drawings.

BRIEF DESCRIPTION OF THE DRAWING

The invention may take physical form in certain parts and arrangement of parts, embodiments of which are described in detail in the specification and illustrated in the accompanying drawings, and wherein.

DETAILED DESCRIPTION OF PREFERRED EMBODIMENT

Referring now to the drawings wherein the showings are for the purpose of illustrating a preferred embodiment of the invention only, and not for the purpose of limiting the same, FIGS. 1A–1D schematically illustrate a process for continuously forming printed circuit boards or multi-layer laminate circuits.

Broadly stated, the process is comprised of a number of different operations performed on a generally continuous, moving web 12. The process includes a copper build-up operation 40 that deposits copper onto one or both sides of moving web 12; a circuit masking operation 110 that applies a masking material on moving web 12 to define a masked, printed circuit pattern on one or both sides of moving web 12; an image forming operation 120; a mask-development process 140 that images and removes excess masking material to define a masked, circuit pattern on the built-up copper on the moving web; a metal-etch operation 150 that etches away exposed copper on the moving web; a resist-stripping operation 160 that removes masking material from the moving web to leave exposed circuit patterns on the moving web; a laminating operation 200 wherein two or more generally continuous webs (having circuit patterns formed on one or both sides thereof) are joined together to form a multi-layer laminate structure having an adhesive layer disposed between adjacent webs; a curing operation 250 wherein the adhesive layer(s) is(are) cured to join the two or more webs permanently together; and a circuit-forming operation 270 wherein portions of the continuously moving web are severed and transferred to an operation, where microvias are formed to connect individual layers of the web together by a metallizing process known in the art. A multi-layer laminate structure formed by the foregoing process may then be applied to a circuit board by conventionally known means.

Web 12

Figure 2:
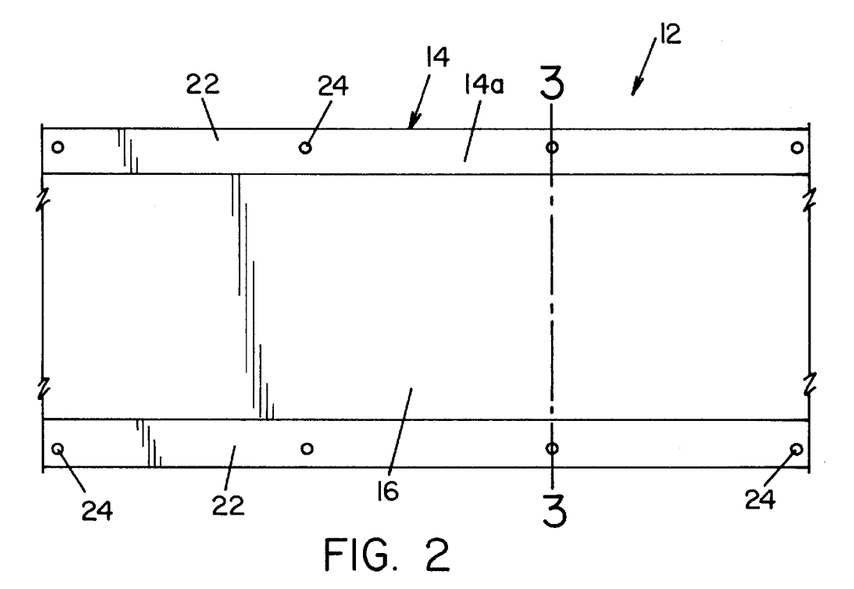
FIG. 2 is a top plan view of a generally continuous strip of a polymeric film having a flash layer of metal thereon.
Figure 3:
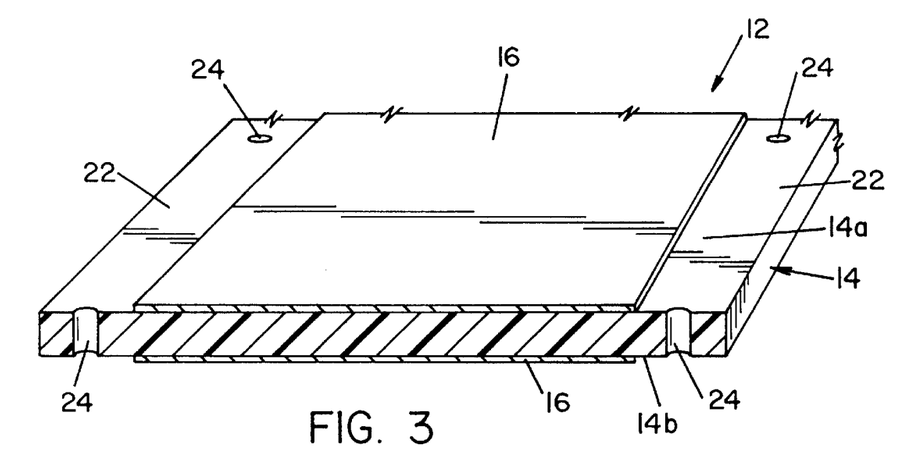
FIG. 3 is an enlarged sectional view taken along line 3—3 of FIG. 1 showing the strip of FIG. 2 at point 3—3 of the process shown in FIG. 1A.

Referring now more specifically to process 10, a generally continuous polymeric web 12, illustrated in FIGS. 2 and 3, is moved along a predetermined path at a predetermined speed. Web 12 is comprised of a polymeric film 14, a first surface 14a and a second surface 14b. A flash layer 16 of metal is applied to both surfaces 14a, 14b. Flash layer 16 may be applied by vapor deposition, sputtering or by an electroless process. Flash layer 16 is applied as a bonding layer, and may be comprised of a base or primary layer (not shown) and one or more layers of metal, as is conventionally known in the art. Flash layer 16 is preferably formed from a metal selected from the group consisting of chromium, chromium-based alloys, copper, nickel-based alloys, titanium, aluminum and iron. Flash layer 16 preferably has a thickness of less than 500 Angstroms (Å), and more preferably, has a thickness of about 50 Å to about 200 Å.

In the embodiment shown, flash layer 16 extends along the interior of polymeric film 14 to define continuous bands or edges 22 of exposed polymeric material. A plurality of spaced apart apertures 24 are formed through polymeric film 14 along exposed edge portions or bands 22. Apertures 24 have predetermined spacing, and are used to locate web 12 at predetermined operations throughout the process in a manner as shall hereinafter be described in greater detail.

Copper Build-up Operation 40

Figure 1A:
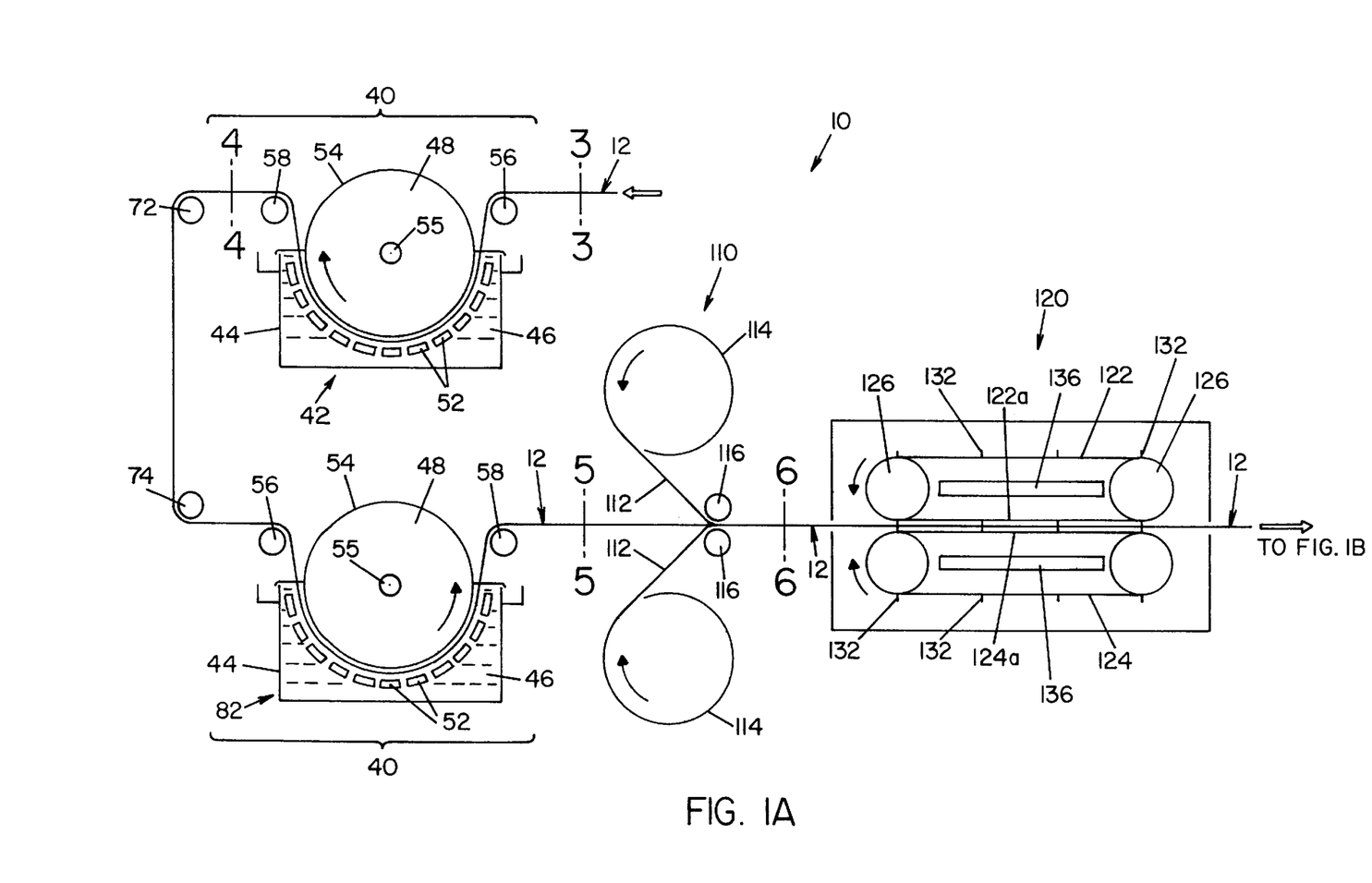
FIGS. 1A–1D are schematic representations of a continuous process for forming a multi-layer, flexible laminate, illustrating a preferred embodiment of the present invention.

Polymeric film 14 moves through copper build-up operation 40 to build up copper on one or both surfaces 14a, 14b of web 12. In the embodiment shown, polymeric film 14 passes through a first electrodeposition cell 42. Cell 42 is comprised of a tank 44 adapted to hold an electrolytic solution 46, a drum 48 partially disposed within the electrolytic solution 46 in tank 44, and a plurality of like anodes 52. Anodes 52 are disposed within tank 44 around drum 48. Drum 48 is cylindrical in shape and, according to the present invention, has a non-conductive outer surface 54. To this end, drum 48 may be formed entirely of a rigid plastic or polymeric material, or be formed of a metal material having an outer casing of a non-conductive material thereon. In the embodiment shown, drum 48 is rotatable upon a shaft 55 which is supported by bearings (not shown) in end walls of tank 44. Drum 48 is preferably rotated by a suitable motor drive (not shown) as is conventionally known in the art, wherein drum 48 may be rotated at a variable circumferential speed to permit web 12 to remain in contact with the electrolytic solution 46 within tank 44 for a sufficient period of time to develop the desired copper thickness on web 12, as will be described in greater detail below.

Electrolytic solution 46 within tank 44 contains metal ions to be deposited on metal flash layer 16 on web 12. Polymeric film 14 moves around drum 48 past anodes 52 within tank 44. Film 14 is guided into tank 44 and around drum 48 by rollers 56, 58.

Specifically, guide roller 56 is provided at the inlet side of cell 42 to position incoming web 12 relative to drum 48. Roller 58 is a cathode pick-up roller provided at the outlet side of cell 42 above and outside of tank 44 and electrolytic solution 46 contained therein. Cathode pick-up roller 58 is positioned to engage surface 14b of film 14 and to be in electrical contact with flash layer 16 thereon as web 12 exits tank 44. Cathode pick-up roller 58 is electrically conductive and designed to be able to conduct the maximum current that can be applied to anodes 52, as will be discussed in greater detail below. Roller 56 may also be a cathode roller, wherein current applied to flash layer 16 by anodes 52 is conducted through flash layer 16 to cathode roller(s) 56, 58 to form an electric circuit resulting in the electrodeposition of metal from electrolytic solution 46 onto flash metal layer 16 on polymeric film 14.

It should be pointed out that metal will build up only on the side of polymeric film 14 facing the anodes 52. In this respect, because of exposed bands 22 of polymeric material formed along the edges of polymeric film 14, a continuous electrical circuit will only be formed on surface 14b, i.e., the side of polymeric film 14 in contact with cathode roller 58. Flash metal 16 on surface 14a of film 14 is not in contact with cathode roller 58 and therefore will not have metal built-up thereon. In other words, exposed bands 22 of polymeric material isolate flash layer 16 on one side of polymeric film 14 from conductive cathode roller 58, thereby preventing build-up on the other side of polymeric film 14.

Figure 4:
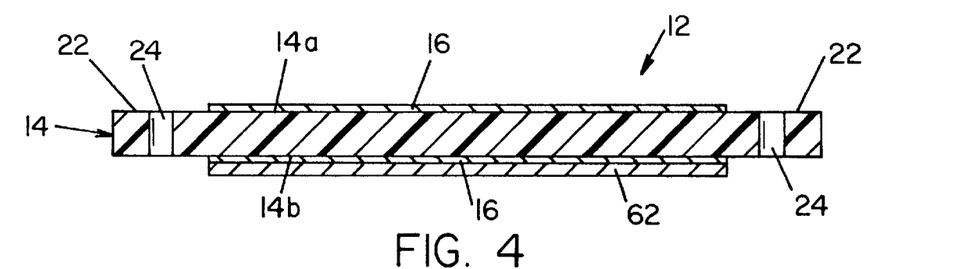
FIG. 4 is a cross-sectional view taken at point 4—4 of the process shown in FIG. 1A, illustrating a build-up of copper on one side of the strip.

FIG. 4 is a cross-sectional view of web 12 after passing through first electrodeposition cell 42. As shown in FIG. 4, a layer of copper 62 is electrodeposited on flash layer 16 on lower surface 14b of polyimide film 14.

Figure 5:
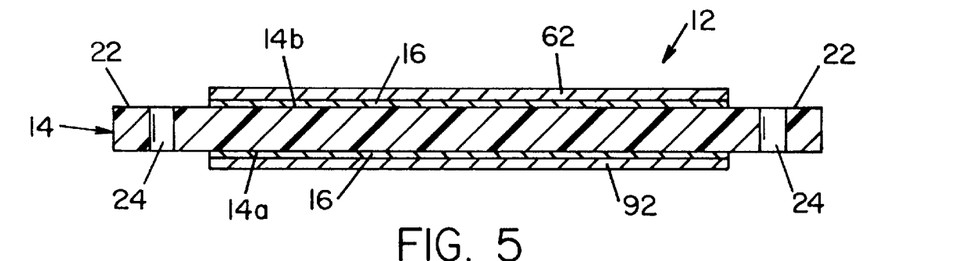
FIG. 5 is a cross-sectional view taken at point 5—5 of the process shown in FIG. 1A, illustrating a build-up of copper on the second side of the strip.

In the embodiment shown, web 12 then passes over guide rollers 72, 74 wherein web 12 is directed into a second electrodeposition cell 82. Cell 82 is basically identical to first electrodeposition cell 42, and therefore like elements bear the same reference numbers as cell 42. As in cell 42, a guide roller 56 is provided at the inlet side of cell 82 to direct web 12 relative to drum 48, and a cathode roller 58 is positioned at the outlet side of cell 82. As shown in FIG. 1A, second electrodeposition cell 82 is disposed below first electrodeposition cell 42, wherein surface 14a of polymeric film 14, is exposed to anodes 52 in second tank 44 to build up a layer 92 of copper on surface 14a of polymeric film 14, as best illustrated in FIG. 5. Copper layers 62, 92 built-up by operation 40, preferably have a thickness of between about 0.2 μm (2000 Å) and about 35 μm.

In accordance with a preferred embodiment of the present invention, the build-up of copper on the polymeric film is preferably performed in accordance with a process disclosed in a co-owned U.S. Pat. No. 5,685,970 that discloses a method of rapidly building up copper onto a moving web by sequentially energizing subsequent anodes along the path of the web with higher energization levels to utilize copper build-up on the moving web to support higher current densities. The disclosure of U.S. Pat. No. 5,685,970 is expressly incorporated herein by reference.

As will be appreciated by those skilled in the art, copper layers 62, 92 may also be formed by an electroless process.

Masking Operation 110

Figure 6:
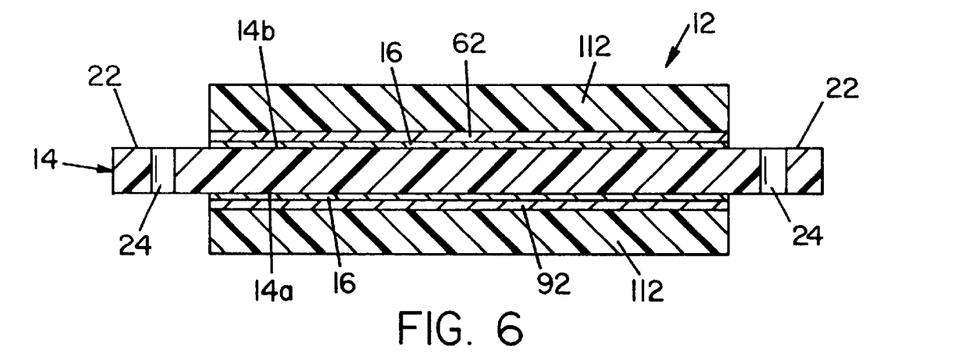
FIG. 6 is a cross-sectional view taken at point 6—6 of the process shown in FIG. 1A, showing layers of a masking material applied to the strip.

Following the build-up of copper layers 62, 92 onto surfaces 14b, 14a respectively of polymeric film 14, moving web 12 undergoes a masking operation 110 where a masking material 112, such as a photosensitive polymer, is applied onto the surface of built-up metal layers 62, 92, according to conventionally known techniques. Masking material 112 is preferably in the form of a continuous ribbon, and is used to define a desired circuit pattern on each side of moving web 12. In the embodiment shown, masking material 112 is applied from a generally continuous roll 114 and is dimensioned to cover the electrodeposited copper layers 62, 92 on each side of moving web 12. Pinch rollers 116 force the ribbon of masking material 112 onto the copper layers 62, 92 to produce a structure shown in cross-section in FIG. 6.

Image Forming Operation 120

With a layer of masking material 112 covering each side of web 12, web 12 undergoes a circuit defining operation 120, wherein a first template is applied onto the upper surface of the moving web and a second template is applied to the lower surface of the moving web. In the embodiment shown, a plurality of like mask templates (not shown) are formed on continuous conveyor belts 122, 124 that move around pairs of rollers 126. One or both rollers 126, associated with belts 122, 124 are driven by means not shown, such that continuous belt 122, 124 are moving at the same speed as moving web 12. Each belt 122, 124 includes a belt run, designated 122a, 124a respectively, that is parallel to web 12 and is positioned thereagainst such that a template on belt 122, 124 moves along with web 12. Locating pins 132 on moving belts 122, 124 are dimensioned to interact with apertures 24 in web 12 so as to locate the circuit pattern templates at specific locations on moving web 12. The circuit pattern template applied to the upper surface of moving web 12 is at specific locations relative to the circuit pattern template applied to the lower surface of moving web 12. In accordance with a preferred embodiment, the circuit pattern templates on each side of moving web 12 are located such that certain connecting points on the circuit patterns are in registry with each other, as will be understood in greater detail from a further reading of the specification.

Basically, the circuit pattern templates applied to the upper and lower surfaces of moving web 12 cover masking material 112 thereon and expose only that portion of masking material 112 that is to form a circuit pattern. A UV light source 136, schematically illustrated in FIG. 1A, radiates masking material 112, exposed by the templates thereby curing the same.

As shown in FIG. 1A, image forming operation 120 is performed on a continuous basis as templates of circuit pattern images merge with moving web 12. The images are positioned at select locations on web 12 through the use of locating pins 132 and apertures 24 on web 12.

Mask Development 140

Figure 1B:
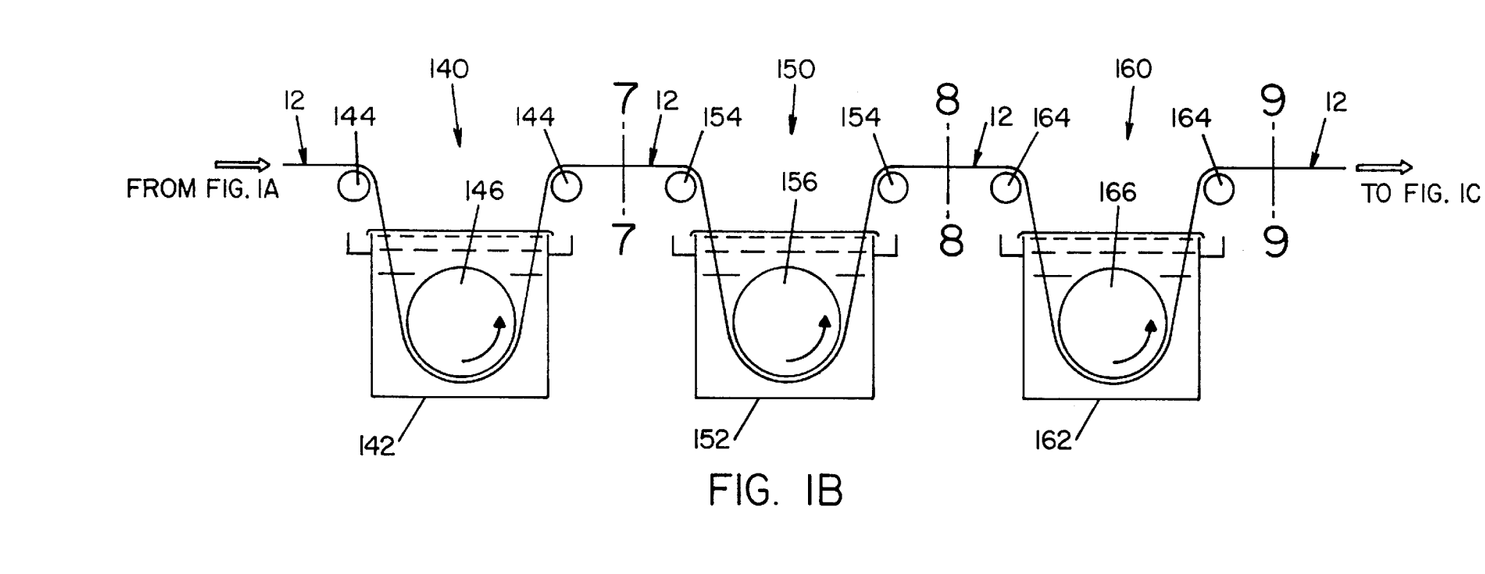
Figure 7:
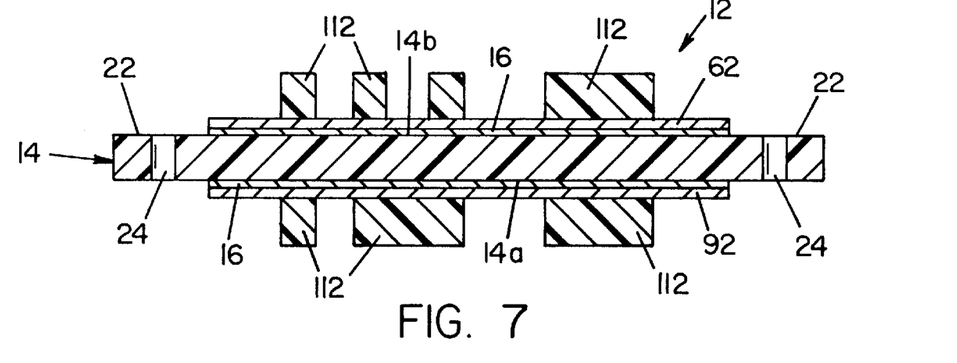
FIG. 7 is a cross-sectional view taken at point 7—7 of the process shown in FIG. 1B, showing portions of the masking material removed to define printed circuit patterns on the strip.

Following the irradiation of masking material 112 in the aforementioned image forming operation 120, moving web 12 passes through a tank 142 to remove uncured masking material 112 from moving web 12. This operation is schematically illustrated in FIG. 1B. As shown in the drawings, web 12 is guided by rollers 144 into the tank around a drum 146. Tank 142 has sufficient depth, wherein both surfaces of moving web 12 are exposed to the solution within tank 142. The solution within tank 142 is operable to remove uncured masking material 112 in a manner that is conventionally known. The effect of the solution is to remove the uncured masking material 112, leaving only cured masking material covering the desired circuit pattern, as illustrated in FIG. 7. The remaining mask material 112 defines circuit branches of a circuit pattern on surfaces of moving web 12.

Metal Etch Operation 150

Figure 8:
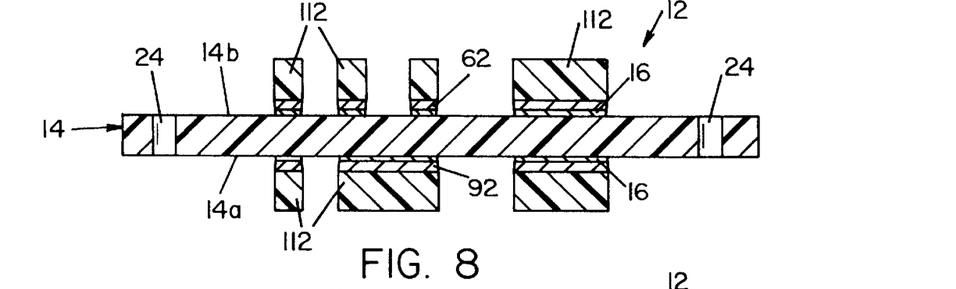
FIG. 8 is a sectional view taken at point 8—8 of the process shown in FIG. 1B, showing printed circuit formed on the strip.

Moving web 12 then undergoes a metal etch operation 150 by entering a metal etch tank 152 containing a solution operable to dissolve any exposed metals. Rollers 154 guide web 12 around a drum 156 within tank 152. The solution within tank 152 is an etch solution, such as sulfuric acid-hydrogen peroxide or cupric chloride, operable to dissolve exposed metal. The etch solution will not, however, dissolve the cured masking material 112. The result of metal etching operation 150 is that layers 62, 92 of electrodeposited copper on flash layer 16, as well as flash layer 16 itself, are dissolved away, leaving only metal that is protected by mask material 112. FIG. 8 illustrates a cross-sectional view of web 12 showing masking material 112 overlaying copper layer 62, 92 (and flash layer 16 there-below) not dissolved by the acid etch solution. As illustrated in FIG. 8, the etch solution tends to undercut the metal of layers 16, 62 and 92 protected by masking material 112. It will of course be appreciated that such undercutting of metal can be taken into account in the designing circuit and the masking templates.

Resist Stripping Operation 160

Figure 9:
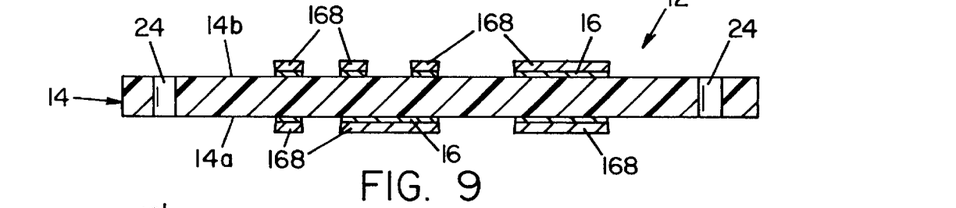
FIG. 9 is a cross-sectional view taken at point 9—9 of the process shown in FIG. 1B, illustrating circuit patterns formed on the polyimide film having the masking material removed therefrom.

Following metal etch operation 150 to remove the unprotected copper and flash layer metal, moving web 12 undergoes a resist stripping operation 160. In the operation, web 12 moves through a mask removal tank 162 that contains a caustic solution, such as potassium hydroxide (KOH) or sodium hydroxide (NaOH) (that is operable to remove the remaining mask material 112 from web 12. Rollers 164 guide moving web 12 around a drum 166 through tank 162. The solution is operable to dissolve cured mask material 112, but has little effect on underlying copper layers 62, 92 or polymeric film 14. Removal of mask material 112 leaves a printed circuit (not shown) on polymeric film 14. The printed circuit is comprised of a number of circuit branches, designated "168" in the drawings. FIG. 9 shows a cross-sectional view of web 12 having circuit branches 168 thereon.

The operations discussed heretofore, with the exception of image forming operation 120, each required passing web 12 through a tank and solution. It is preferred that between such operations that residual solution be cleaned from web 12 by some type of water rinse operations, such as passing web 12 through a rinse bath or water spray directed onto web 12. Such rinse operations are conventionally known in the art, but have not been illustrated in the drawings to simplify the showings thereof.

Web 12 having printed circuit(s) found thereon may be wound onto a roll for subsequent use as part of a printed circuit board or multi-layer laminate.

Laminating Operation 200

In accordance with the present invention, following resist stripping operation 160, web 12 with printed circuit(s) thereon is laminated with one or more other similarly formed webs having printed circuits found thereon, as part of a continuous process.

Figure 1C:
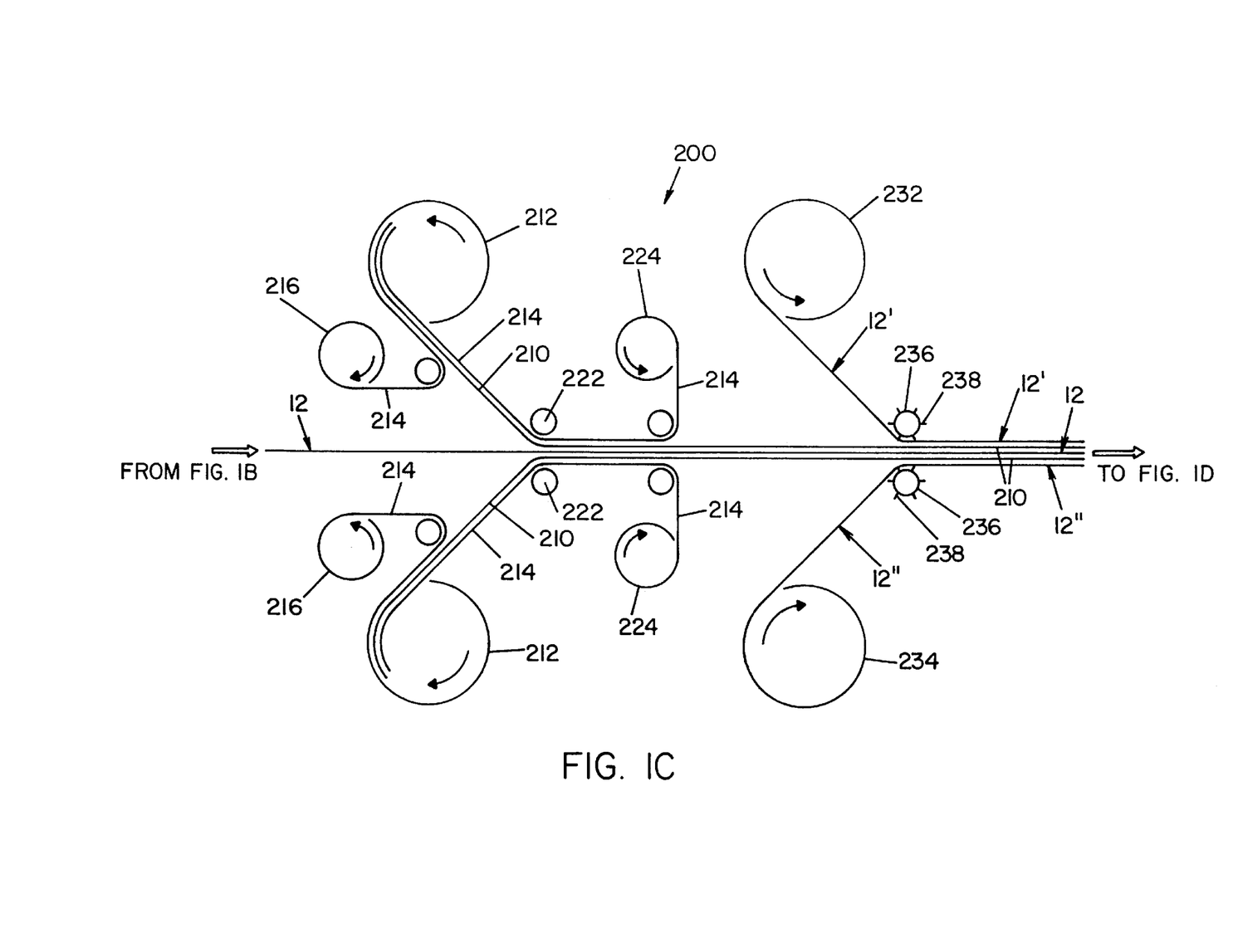

Referring now to FIG. 1C, web 12 is joined to web 12' and web 12" to form a multi-layer laminate. Web 12' and web 12" are preferably formed by a process as heretofore described. Webs 12' and 12" have circuit patterns found thereon that are designed to correspond to circuit patterns on web 12 to form a circuit structure as hereinafter described. As will be appreciated, the circuit patterns on webs 12' and 12" may be different from those on web 12. A uniform layer of an adhesive material is applied between the mating surfaces of web 12, 12' and 12". The adhesive may be acrylics, epoxies, urethanes or cyanoacrylates and may be applied by wiping or knife blading a layer onto the surface of webs 12, 12' and 12". In another embodiment, where two-part adhesive systems are used, the adhesive may be applied to one web while the curing agent or catalyst is applied to the other web, the webs thereafter being joined together. In a preferred embodiment, the adhesive is a resin that is at least partially uncured. More specifically, the adhesive is a resin film, designated 210, that is uncured, or substantially uncured, and is dimensionally stable under the exertion of stacking forces along its surface. As used herein, the term "dimensionally stable," as applied to the uncured resin material, shall mean the resinous material will not significantly alter its shape or flow under the pressure exerted along its planar surface as the result of stacking pressure. Basically, the term "dimensionally stable" is intended to apply to solventless resin film as compared to a liquid resin that flows under the exertion of planar pressure.

A product manufactured and sold by Minnesota Mining & Manufacturing (3M) under the name "High Performance Epoxy Adhesive Bonding Film" finds advantageous use as resin layer in the production of laminate. This product is comprised of an epoxy resin and is available in thicknesses of 1 or 2 mils under 3M designations "9901" and "9902" respectively. The material is provided by the manufacturer with removable protective polymer films on both surfaces thereof. The material has the following physical properties as disclosed by the manufacturer:

| Property | Units | | IPC Test |
| --- | --- | --- | --- |
| Glass Transition* | ° C. | 180 | |
| CTE  20°–110° C. | Ppm/° C. | 60 | |
| 110°–180° C. | | 87 | |
| 180°–250° C. | | 213 | |
| Peel Strength | Lbs./inch | 8 | 2.4.9 |
| Volatile Content | % | 1 | 2.3.37 |
| Moisture Absorption | % | 1.7 | 2.6.2B |
| Chemical Resistance | % | >90 | 2.3.2 |
| Dielectric Constant* | | 3.4 | 2.5.5.3 |
| Dissipation Factor* | | .022 | 2.5.5.3 |
| Dielectric Strength | Volts/mil | 2200 | D-149 |
| Insulation Resistance | Megohms | 1.00E + 06 | 2.6.3.2 |
| Volume Resistivity | Megohms-cm | 5.00E + 07 | 2.5.17 |
| Surface Resistivity | Megohms | 7.00E + 05 | 2.5.17 |
| Solder Float | | Pass | 2.4.13 |
| Low Temperature Flexibility | | Pass | 2.6.18 |
| Flexural Endurance | Cycles | 1787 | 3.7.4 |
| Fracture Toughness | Mpa*m$^{1/2}$ | 0.65 | |
| Modulus | GPa | 3.5 | |

*Tests performed on neat resin.

Adhesive film 210 is applied to the surfaces of moving web 12 from large generally continuous rolls 212. Adhesive film 210 includes removable protective layers 214 formed of a polymer film that are removed by takeup rollers 216.

A pair of heat pinch rollers 222 press adhesive films 210 onto the exposed circuit pattern on web 12. As shown in FIG. 1C, outer protective film 214 on adhesive film 210 protects adhesive film 214 during the rolling of the adhesive by rollers 222. Protective film 214 is subsequently removed by takeup rolls 224. Web 12 moves past two rolls 232, 234 that respectively hold webs 12' and 12", each of which is a generally continuous strip of polymer film having printed circuits formed thereon. As indicated above, the webs 12' and 12" on rolls 232, 234 include electronic circuit patterns adapted to mate and align with the circuit patterns formed on moving web 12. These rolls of continuous polymer film may be formed according to the process heretofore described. Alternately, parallel processing lines containing the operations heretofore described could be operated simultaneously, and polymeric films having specific circuit patterns thereon could be merged as shall hereinafter be described. Webs 12' and 12" from rolls 232, 234 are unwound and merged with moving web 12. A pair of pinch rollers 236 having locating pins 238 press webs 12, 12' and 12" together. Locating pins 238 on rollers 236 interact with apertures 24 in webs 12, 12' and 12" to position and align the three webs in proper relative position to each other, thereby aligning the respective circuit patterns on each web 12, 12' and 12".

Curing Operation 250

Figure 1D:
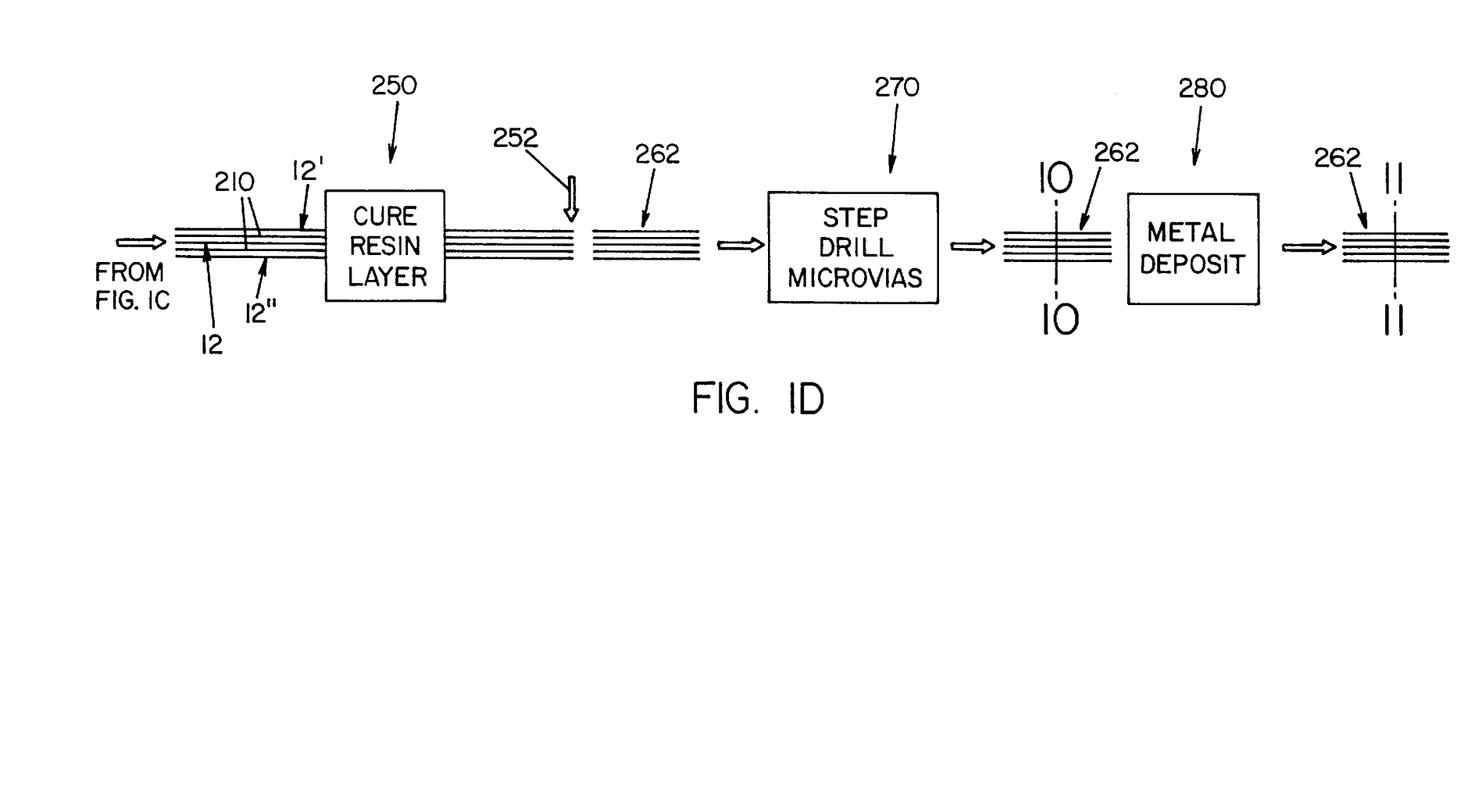

With the three circuit-carrying, polymer webs 12, 12' and 12" joined together by adhesive film 210, the laminate structure formed thereby is then cured as schematically illustrated in FIG. 1D. The curing may be by means of heat or ultraviolet light. The curing effectively bonds the three circuit-carrying webs 12, 12' and 12" together.

Figure 10:
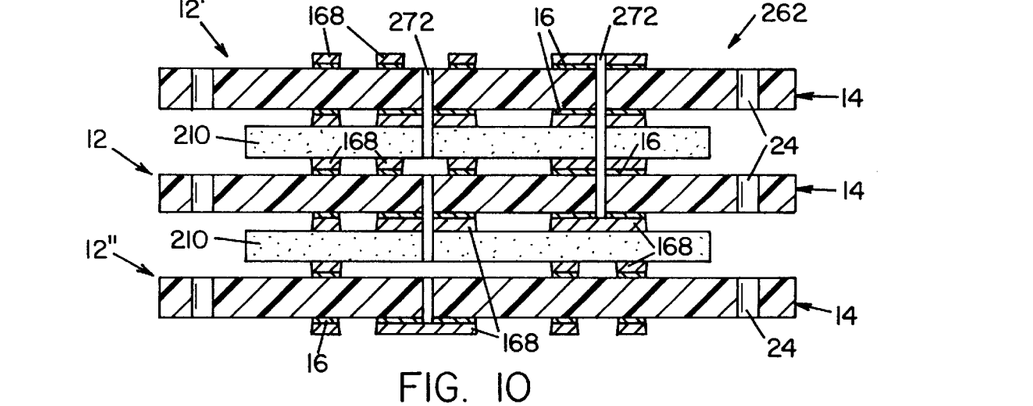
FIG. 10 is a cross-sectional view of a multi-layer laminate structure taken at point 10—10 of the process shown in FIG. 1D, illustrating microvias formed through layers of the multi-layer laminate.
Figure 11:
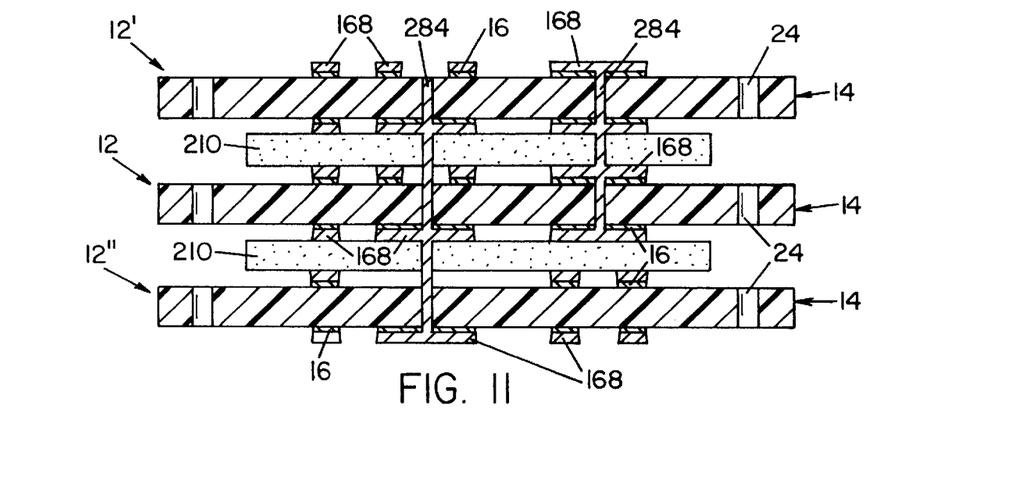
FIG. 11 is a cross-sectional view of a multi-layer laminate taken at point 11—11 of the process shown in FIG. 1D.

The resulting laminate has six layers of circuit patterns positioned at predetermined locations relative to each other, as illustrated in FIG. 10. Each circuit pattern is isolated from an adjacent circuit pattern by either polymeric film 14 or by the cured adhesive film 210. The resulting laminate may be sheared into separate circuits by a cutter 252, schematically illustrated in FIG. 1D, to form multi-layer laminate section 262. The position of the circuits on webs 12, 12' and 12" are such that an individual laminate section 262 may be severed from a section 262 preceding it and from a section 262 subsequent to it without interfering with the circuit patterns formed on each laminate section 262.

Circuit Forming Operation 270

Using conventionally known techniques, a microvia forming operation 270 forms microvias 272 into the specific layers in laminate section 262, as illustrated in FIG. 10. In this respect, the depth of microvias 272 is determined to connect specific levels of circuits to circuits on a different level. FIG. 10 shows a cross-section of a laminate section 262 having six circuit layers with microvias formed through such layers to connect select layers in the circuit to each other.

By conventionally known electroless operations, or a combination of electroless and electrodeposition operations, designated 280, microvias 272 are filled with conductive material 284 to connect circuit patterns on specific levels with circuit patterns on another level. The resulting structure may then be applied to a board, to provide rigidity to the entire structure.

The present invention thus provides a method of continuously forming multi-layer circuit structures in a continuous process. By continuously forming the structures, complex methods of securing layers of copper foil onto printed circuit boards or onto other foil layers are avoided. Large volumes of like circuits can be formed by a continuous process.

The foregoing description is a specific embodiment of the present invention. It should be appreciated that this embodiment is described for purposes of illustration only, and that numerous alterations and modifications may be practiced by those skilled in the art without departing from the spirit and scope of the invention. It is intended that all such modifications and alterations be included insofar as they come within the scope of the invention as claimed or the equivalents thereof.

What is claimed is:

1. A method of continuously forming a multi-layer laminate, comprising the steps of:
    a) forming a generally continuous first strip comprised of a polyimide film having a flash layer of metal deposited on at least one side thereof;
    b) moving said first strip along a first path through a metal plating bath,
    c) depositing metal onto said flash layer of metal as said first strip passes through said bath to form a built-up layer of metal on said flash layer of metal;
    d) applying a masking material to the surface of said built-up layer of metal on said first strip;
    e) curing portions of said masking material to define a masked circuit pattern;
    f) removing uncured portions of said masking material to leave exposed portions of said built-up layer of metal not covered by cured masking material;
    g) etching away said flash layer of metal and said built-up layer of metal on said first strip wherein said masked circuit pattern and said built-up layer and said flash layer thereunder remain on said first strip;
    h) removing said cured masking material wherein a first printed circuit remains on said first strip;
    i) moving a second strip comprised of a polyimide film along a second path that merges with said first paths said second strip having a second printed circuit formed thereon in accordance with steps b) through h), said second printed circuit having a predetermined shape adapted to mate in complimentary fashion with said first printed circuit when overlaid thereon;
    j) interlaying a dimensionally stable, uncured adhesive film between said first strip and said second strip;
    k) joining together said first strip, said adhesive film and said second strip wherein said first printed circuit on said first strip is in registry with said second printed circuit on said second strip;
    l) curing said adhesive film to bond said first strip to said second strip; and
    m) forming microvias between said first strip and said second strip to connect locations of said first printed circuit with locations of said second printed circuit.

2. A method as defined in claim 1, wherein said built-up layer of metal is deposited on said flash layer of metal by an electrodeposition process.

3. A method as defined in claim 1, wherein said built-up layer of metal is deposited on said flash layer of metal by an electroless chemical deposition process.

4. A method as defined in claim 2, wherein said flash layer of metal is selected from the group consisting of chromium, nickel, titanium, aluminum, iron and alloys thereof.

5. A method as defined in claim 4, wherein said flash layer of metal is chromium, and said chromium has a thickness of about 50 Å to about 200 Å.

6. A method as defined in claim 5, wherein said built-up layer of metal deposited on said flash layer of metal is copper, and said copper has a thickness of less than 35 $\mu$m.

7. A method of forming a multi-layer laminate, comprising the steps of:
    a) forming a generally continuous first strip comprised of a polyimide film having a flash layer of metal deposited on at least one side thereof;
    b) moving said first strip of polyimide film along a first path through a metal plating bath;
    c) depositing metal onto said flash layer of metal as said first strip passes through said bath wherein a built-up layer of metal is deposited onto said flash layer of metal;
    d) applying a masking material to portions of said built-up metal on said first strip to define a first masked circuit pattern thereon;
    e) etching away said flash layer of metal and said built-up layer of metal on strip wherein said masked circuit pattern remains on said first strip;
    f) removing said masking material to expose a first printed circuit formed of said flash layer of metal and said built-up layer of metal;

g) moving a second strip comprised of a polyimide film along a second path that merges with said first path, said second strip having a second printed circuit formed thereon in accordance with steps b) through f), said second printed circuit having a predetermined shape adapted to mate in complimentary fashion with said first printed circuit when overlaid thereon;

h) joining said first strip to said second strip wherein said first printed circuit on said first strip is in registry with said second printed circuit on said second strip and is separated by a non-conductive layer; and i) forming microvias between said first strip and said second strip to connect locations of said first printed circuit with locations of said second printed circuit.

8. A method as defined in claim 7, wherein said joining step includes interlaying a dimensionally stable, uncured adhesive film between said first strip and said second strip.

9. A method as defined in claim 8, wherein said adhesive film is cured to bond said first strip to said second strip.

10. A method as defined in claim 9, wherein said built-up layer of metal is deposited on said flash layer of metal by an electrodeposition process.

11. A method as defined in claim 10, wherein said flash layer of metal is selected from the group consisting of chromium, nickel, titanium, aluminum, iron and alloys thereof.

12. A method as defined in claim 11, wherein said flash layer of metal is chromium and said metal deposited on said flash layer is copper.

13. A method as defined in claim 12, wherein said chromium has a thickness of about 50 Å to about 200 Å, and said copper has a thickness of less than 35 $\mu$m.

14. A method as defined in claim 9, wherein said built-up layer of metal is deposited on said flash layer of metal by an electroless process.

15. A method as defined in claim 7, wherein said joining steps includes applying a layer of a first adhesive component to said first strip and applying a layer of a second adhesive component to said second strip.

* * * * *